(12) United States Patent
Cheng

(10) Patent No.: US 7,777,528 B1
(45) Date of Patent: Aug. 17, 2010

(54) PHASE DETECTION MODULE AND PHASE DETECTION METHOD

(75) Inventor: Wen-Chang Cheng, Taoyuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 12/471,404

(22) Filed: May 24, 2009

(30) Foreign Application Priority Data

Mar. 17, 2009 (TW) .............................. 98108664 A

(51) Int. Cl.
*H03D 13/00* (2006.01)
(52) U.S. Cl. ......................................................... 327/3
(58) Field of Classification Search .................. 327/2, 327/3, 5, 7–10, 12, 147–150, 156–159, 162, 327/163; 331/1 R, 17, 18, 25, 1 A
See application file for complete search history.

(56) References Cited

U.S. PATENT DOCUMENTS

| | | | | |
|---|---|---|---|---|
| 4,812,783 A * | 3/1989 | Honjo et al. | .................. | 331/20 |
| 6,188,289 B1 * | 2/2001 | Hyeon | .......................... | 331/17 |
| 6,246,292 B1 * | 6/2001 | Ono | .............................. | 331/2 |
| 7,030,711 B2 * | 4/2006 | Steinbach et al. | ........... | 331/179 |
| 7,161,435 B2 * | 1/2007 | Konno | .......................... | 331/16 |
| 7,301,413 B2 * | 11/2007 | Sekimoto | .................... | 331/179 |
| 7,675,335 B1 * | 3/2010 | Cheng | ......................... | 327/160 |

\* cited by examiner

*Primary Examiner*—Lincoln Donovan
*Assistant Examiner*—Patrick O'Neill
(74) *Attorney, Agent, or Firm*—Winston Hsu

(57) ABSTRACT

A phase detection module includes a phase detection unit, a plurality of comparators and a decision unit. The phase detection unit is utilized for comparing a first input signal and a second signal to generate a phase detection result. The plurality of comparators is utilized for comparing the phase detection result with a plurality of predetermined voltages to generate a plurality of comparing results, respectively. The decision unit is utilized for deciding a phase relationship between the first and second input signals according to the plurality of comparing results.

12 Claims, 2 Drawing Sheets

PHASE DETECTION MODULE AND PHASE DETECTION METHOD

BACKGROUND OF THE INVENTION

1. Field of the Invention

The invention relates to a phase detection module, and more particularly, to a phase detection module which can precisely determine a phase relationship between two signals when there is only a small phase difference between the two signals.

2. Description of the Prior Art

A circuit applied for signal processing, such as a phase-locked loop (PLL), usually includes a phase detector which is used to compare a phase difference between two signals. A comparing result outputted from the phase detector is inputted into another signal processing unit. When there is only a small phase difference between two signals, however, the phase detector may not precisely determine a phase relationship between the two signals due to noise or jitter issues, resulting in errors in the following signal processing.

SUMMARY OF THE INVENTION

It is therefore an objective of the present invention to provide a phase detection module which can precisely determine a phase relationship between two signals even when a phase difference between the two signals is small, in order to solve the above-mentioned problem.

According to one embodiment of the present invention, a phase detection module comprises a phase detection unit, a plurality of comparators and a decision unit. The phase detection unit is utilized for comparing a first input signal with a second input signal to generate a phase detection result. The plurality of comparators are utilized for comparing the phase detection result with a plurality of predetermined voltages, respectively, to generate a plurality of comparing results. The decision unit is utilized for determining a phase relationship between the first and the second input signals according to the plurality of comparing results.

According to another embodiment of the present invention, a phase detection method comprises: comparing a first input signal with a second input signal to generate a phase detection result; comparing the phase detection result with a plurality of predetermined voltages, respectively, to generate a plurality of comparing results; and determining a phase relationship between the first and the second input signals according to the plurality of comparing results.

According to the phase detection module and the phase detection method of the present invention, the detected phase relationship between two input signals is not influenced by noise and jitter issues, and is more accurate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
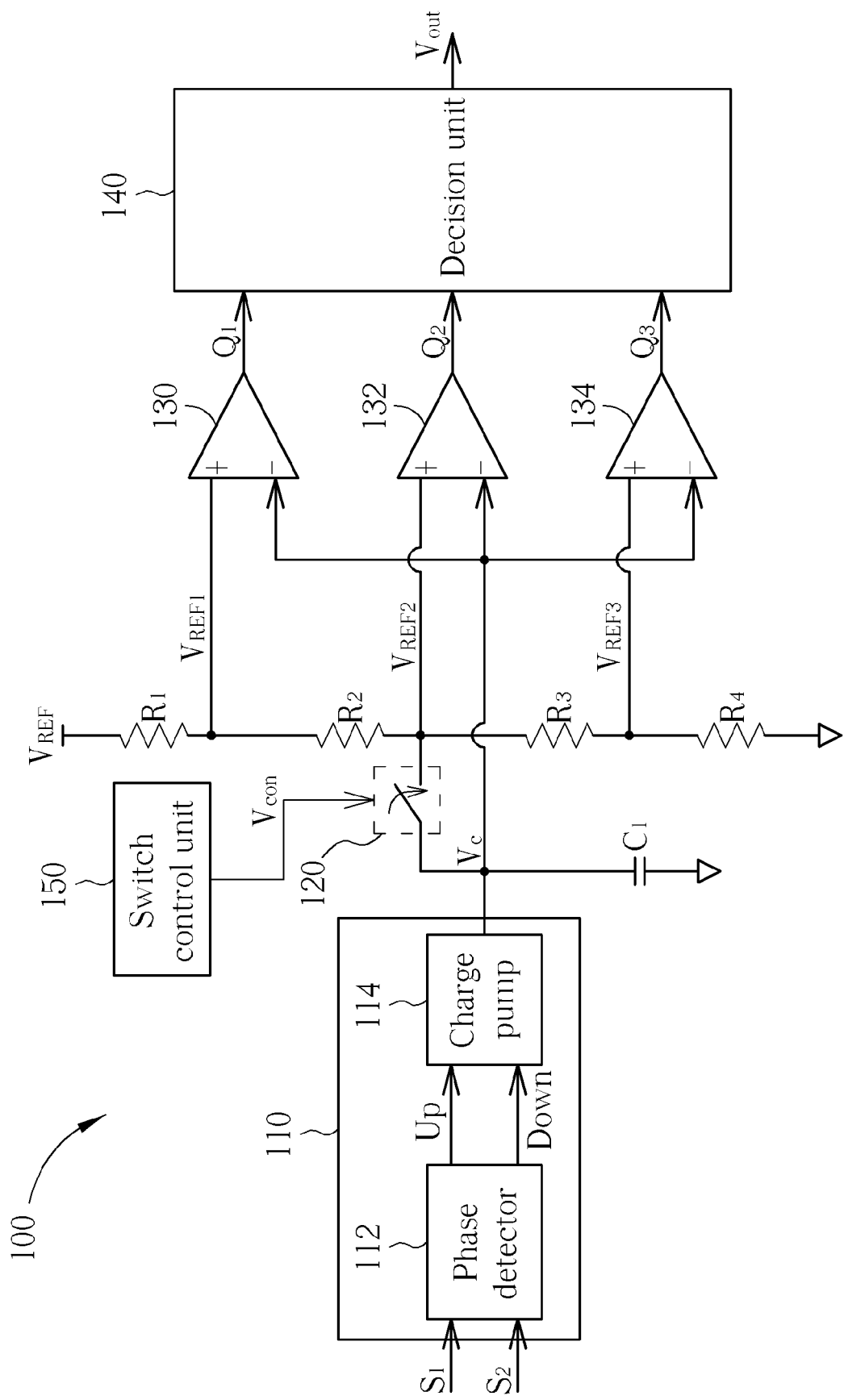
FIG. 1 is a diagram illustrating a phase detection module according to one embodiment of the present invention.

Please refer to FIG. 1. FIG. 1 is a diagram illustrating a phase detection module 100 according to one embodiment of the present invention. As shown in FIG. 1, the phase detection module 100 includes a phase detection unit 110, a switch 120, three comparators 130, 132 and 134, a decision unit 140, a capacitor $C_1$ and resistors $R_1$-$R_4$, where the phase detection unit 110 includes a phase detector 112 and a charge pump 114.

In the operations of the phase detection module 100, first, two input signals $S_1$ and $S_2$ are inputted into the phase detector 112 to generate an up signal Up and a down signal Down, respectively. Then, the charge pump 114 charges/discharges the capacitor $C_i$ according to the up signal Up and the down signal Down to generate a phase detection result $V_c$, where the phase detection result $V_c$ is a voltage value used to represent the phase difference between the input signals $S_1$ and $S_2$. The operations of the phase detector 112 and the charge pump 114 are well known by a person skilled in the art, and therefore detailed descriptions are omitted here.

Then, as shown in FIG. 1, the phase detection result $V_c$ is inputted into negative terminals of the comparators 130, 132 and 134, and positive terminals of the comparators 130, 132 and 134 are connected to predetermined voltages $V_{REF1}$, $V_{REF2}$ and $V_{REF3}$, respectively. The comparators 130, 132 and 134 compare the phase detection result $V_c$ with the predetermined voltages $V_{REF1}$, $V_{REF2}$ and $V_{REF3}$, respectively, to generate comparing results $Q_1$, $Q_2$ and $Q_3$. The comparing results $Q_1$, $Q_2$ and $Q_3$ can be logic values, for example, if $Q_1$ is at a state of logic "1", it represents that the predetermined voltage $V_{REF1}$ is greater than the phase detection result $V_c$; if $Q_1$ is at a state of logic "0", it represents that the predetermined voltage $V_{REF1}$ is less than the phase detection result $V_c$. After that, the decision unit 140 determines the phase relationship between the input signals $S_1$ and $S_2$ according to the comparing results $Q_1$, $Q_2$ and $Q_3$ and outputs an output signal $V_{out}$.

However, when the phase difference between the input signals $S_1$ and $S_2$ are small, if the phase of the input signals $S_1$ and $S_2$ are compared once, the phase detection result $V_c$ may not accurately represent the phase difference between the input signals $S_1$ and $S_2$ due to the noise and jitter issues, and it becomes likely that an error exists in the phase relationship determined by the decision unit 140 according to the comparing results $Q_1$, $Q_2$ and $Q_3$. Therefore, in the present invention, the decision unit 140 determines the phase relationship between the input signals $S_1$ and $S_2$ after the capacitor $C_1$ is charged/discharged for a time $t_D$, where the time $t_D$ includes a plurality of cycles of one of the input signals $S_1$ and $S_2$. In other words, the phase detection result $V_c$ of the present invention is generated by the phase detection unit 110 comparing the phase of the input signals $S_1$ and $S_2$ many times. Under the assumption that there is white noise on the input signals $S_1$ and $S_2$, the noise effect will be cancelled by accumulating many phase differences between the input signals $S_1$ and $S_2$, and an accurate phase difference is therefore obtained. For example, it is assumed that there is an ideal increased voltage $V_{err}$ on the capacitor $C_1$ after the phase detection unit 110 detects the phase difference between the input signals $S^1$ and $S_2$ once, where, in reality, the increased voltage on the capacitor $C_1$ is ($V_{err}+n_i$), $n_i$ being a voltage variation on the capacitor $C_1$ caused by the noises on the input signals $S_1$ and $S_2$. In the present invention, assuming that the phase detection unit 110 detects the phase difference between the input signals $S_1$ and $S_2$ twenty times, the accumulated voltage value on the capacitor $C_1$ is $(V_{err}+n_1)+(V_{err}+n_2)+(V_{err}+n_3)+ \ldots +(V_{err}+n_{20})$. Because the noises $n_i$, $n_z$, $n_3$, ..., $n_{zo}$ are almost mutually counter-balanced, the accumulated voltage value on the capacitor $C_1$ approaches $20*V_{err}$. Therefore, the noise effect is reduced.

It is noted that, in the phase detection module 100, the predetermined voltages $V_{REF1}$, $V_{REF2}$ and $V_{REF3}$ are generated by a voltage divider (including resistors $R_1$-$R_4$) and a reference voltage $V_{REF}$. In other embodiments of the present invention, however, the predetermined voltages $V_{REF1}$, $V_{REF2}$ and $V_{REF3}$ can be generated by another circuit. This alternative design also falls within the scope of the present invention.

Figure 2:
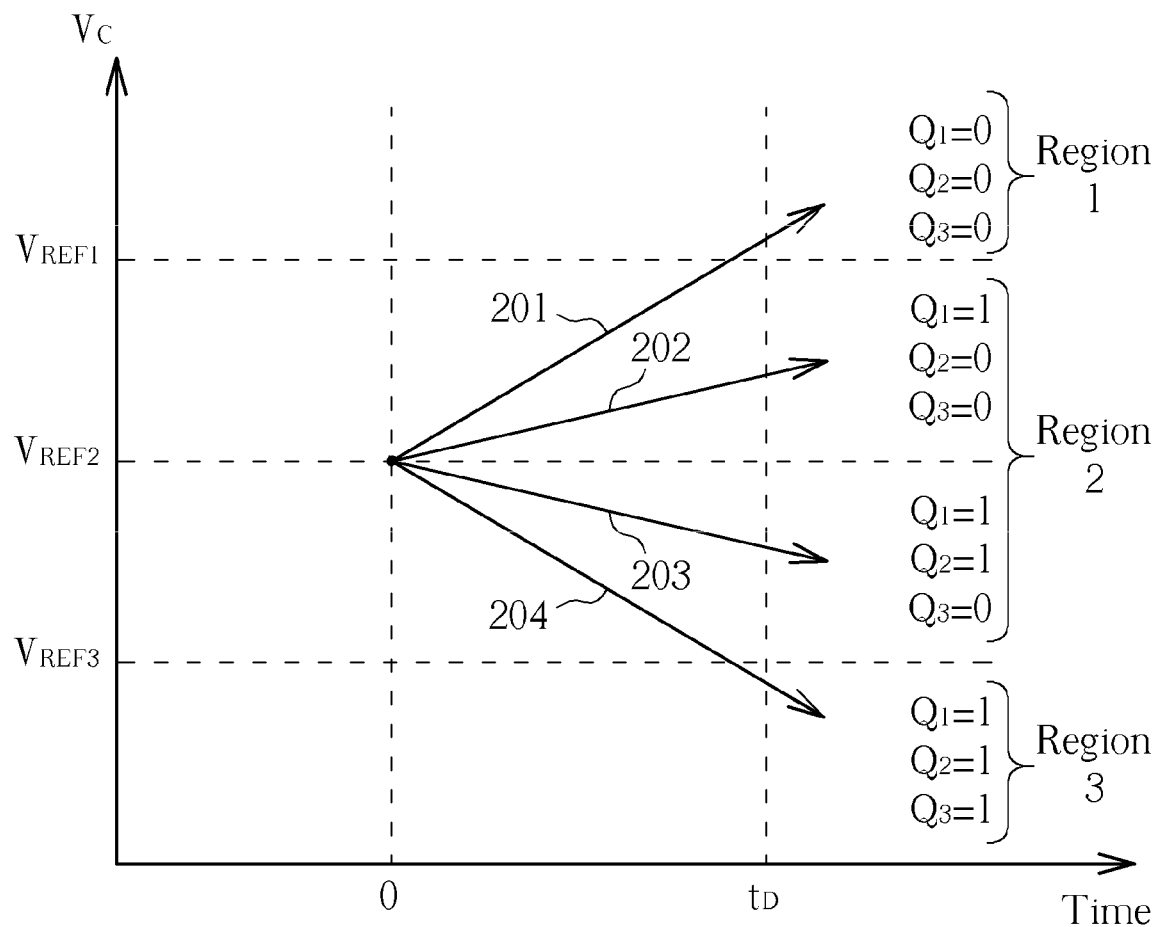
FIG. 2 is a diagram illustrating how the decision unit determines the phase relationship between two input signals.

To understand the present invention more clearly, please refer to FIG. 1 and FIG. 2 together. FIG. 2 is a diagram illustrating how the decision unit 140 determines the phase relationship between the input signals $S_1$ and $S_2$. As shown in FIG. 2, at time t=0, the phase detection result $V_c$ (i.e., the voltage at the output terminal of the phase detection unit 110) is equal to $V_{REF2}$. At this time, the phase detection unit 110 receives the input signals $S_1$ and $S_2$ and generates a current according to the phase difference between the input signals $S_1$ and $S_2$ to charge/discharge the capacitor $C_1$, and the phase detection result $V_c$ therefore rises or goes down over time (lines 201-204 shown in FIG. 2). After a predetermined time $t_D$, that is t=$t_D$, the decision unit 140 begins to determine the phase relationship between the input signals $S_1$ and $S_2$ according to the comparing results $Q_1$, $Q_2$ and $Q_3$. In this embodiment, when the comparing results $Q_1$, $Q_2$ and $Q_3$ are at states of logic "0", "0", "0", respectively, this represents that the phase detection result $V_c$ is greater than the predetermined voltage $V_{REF1}$ (phase detection result $V_c$ is in the region 1), and the decision unit 140 determines that a phase error exists between the input signals $S_1$ and $S_2$ (in this embodiment, it represents that the phase of the input signal $S_1$ leads the phase of the input signal $S_2$). When the comparing results $Q_1$, $Q_2$ and $Q_3$ are at states of logic "1", "0", "0" or "1", "1", "0", respectively, this represents that the phase detection result $V_c$ is between the predetermined voltages $V_{REF1}$ and $V_{REF3}$ (phase detection result $V_c$ is in the region 2), and the decision unit 140 determines that no phase error exists between the input signals $S_1$ and $S_2$. When the comparing results $Q_1$, $Q_2$ and $Q_3$ are at states of logic "1", "1", "1", respectively, this represents that the phase detection result $V_c$ is less than the predetermined voltage $V_{REF3}$ (phase detection result $V_c$ is in the region 3), and the decision unit 140 determines that a phase error exists between the input signals $S_1$ and $S_2$ (in this embodiment, it represents that the phase of the input signal $S_1$ lags the phase of the input signal $S_2$).

After the decision unit 140 determines the phase relationship between the input signals $S_1$ and $S_2$ at time t=$t_D$, a switch control unit 150 outputs a control signal $V_{con}$ to turn on the switch 120 in order to make the phase detection result $V_c$ be reset by the predetermined voltage $V_{REF2}$. In other words, the voltage level of the output terminal of the phase detection unit 110 will go back to the predetermined voltage $V_{REF2}$; that is, a status at time t=0 shown in FIG. 2.

It is noted that, in the phase detection module 100 of the present invention, the predetermined voltages $V_{REF1}$, $V_{REF2}$ and $V_{REF3}$ are connected to the terminals with the same polarity of the comparators 130, 132 and 134, respectively. In other embodiments of the present invention, however, the predetermined voltages $V_{REF1}$, $V_{REF2}$ and $V_{REF3}$ can be connected to the terminals with different polarities of the comparators 130, 132 and 134, respectively. As long as the decision unit 140 can determine in which region shown in FIG. 2 the phase detection result $V_c$ is located according to the comparing results $Q_1$, $Q_2$ and $Q_3$ respectively outputted from the comparators 130, 132 and 134, this alternative design also falls within the scope of the present invention.

Briefly summarized, the phase detection module of the present invention determines the phase relationship between two input signals after the charge pump charges/discharges the capacitor for a predetermined time, where the predetermined time is greater than a cycle of one of the two input signals. In this way, the noise and jitter effects are reduced and the detecting result of the phase detection module is more accurate.

Those skilled in the art will readily observe that numerous modifications and alterations of the device and method may be made while retaining the teachings of the invention.

What is claimed is:

1. A phase detection module, comprising:
   a phase detection unit, for comparing a first input signal and a second input signal to generate a phase detection result;
   a plurality of comparators, coupled to the phase detection unit, for comparing the phase detection result with a plurality of predetermined voltages, respectively, to generate a plurality of comparing results; and
   a decision unit, coupled to the plurality of comparators, for determining a phase relationship between the first input signal and the second input signal according to the plurality of comparing results;
   wherein the phase detection result is a voltage value, the plurality of comparators include a first comparator, a second comparator and a third comparator, the first, the second and the third comparators compare the phase detection result with a first, a second and a third predetermined voltages to generate a first, a second and a third comparing results, respectively, where the first predetermined voltage is greater than the second predetermined voltage, and the second predetermined voltage is greater than the third predetermined voltage, and the first, the second and the third predetermined voltages are connected to input terminals with the same polarity of the first, the second and the third comparators, respectively.

2. The phase detection module of claim 1, wherein when the decision unit decides that the phase detection result is greater than the first predetermined voltage or less than the third predetermined voltage according to the first, the second and the third comparing results, the decision unit determines a phase error exists between the first and the second input signals.

3. The phase detection module of claim 1, wherein when the decision unit decides that the phase detection result is between the first and the third predetermined voltages according to the first, the second and the third comparing results, the decision unit determines no phase error exists between the first and the second input signals.

4. The phase detection module of claim 1, wherein the phase detection unit comprises:
   a phase detector, for generating an up signal and a down signal according to the first input signal and the second input signal; and
   a charge pump, for charging/discharging a capacitor according to the up signal and the down signal to generate the phase detection result;
   wherein after the charge pump charges/discharges the capacitor for a predetermined time, the decision unit determines the phase relationship between the first input signal and the second input signal according to the plurality of comparing results; and the predetermined time is greater than a cycle of either one of the first and the second input signals.

5. The phase detection module of claim 4, further comprising:
   a switch, coupled between the capacitor and the second predetermined voltage; and
   a switch control unit, for generating a control signal to switch on/off the switch.

6. The phase detection module of claim 5, wherein after the decision unit determines the phase relationship between the first and the second input signals according to the plurality of comparing results, the switch control unit outputs the control signal to switch on the switch in order to make the phase detection result be reset by the second predetermined voltage.

7. A phase detection method, comprising:
   comparing a first input signal and a second input signal to generate a phase detection result;
   comparing the phase detection result with a plurality of predetermined voltages, respectively, to generate a plurality of comparing results; and
   determining a phase relationship between the first input signal and the second input signal according to the plurality of comparing results;
   wherein the phase detection result is a voltage value, and the step of comparing the phase detection result with the plurality of predetermined voltages, respectively, to generate the plurality of comparing result comprises:
      comparing the phase detection result with a first, a second and a third predetermined voltages to generate a first, a second and a third comparing results, respectively, where the first predetermined voltage is greater than the second predetermined voltage, and the second predetermined voltage is greater than the third predetermined voltage.

8. The phase detection method of claim 7, wherein the step of determining the phase relationship between the first input signal and the second input signal according to the plurality of comparing results further comprises:
   when it is determined that the phase detection result is greater than the first predetermined voltage or less than the third predetermined voltage according to the first, the second and the third comparing results, determining a phase error exists between the first and the second input signals.

9. The phase detection method of claim 7, wherein the step of determining the phase relationship between the first input signal and the second input signal according to the plurality of comparing results further comprises:
   when it is determined that the phase detection result is between the first and the third predetermined voltages according to the first, the second and the third comparing results, determining no phase error exists between the first and the second input signals.

10. The phase detection method of claim 7, wherein the step of comparing the first input signal and the second input signal to generate the phase detection result comprises:
   generating an up signal and a down signal according to the first input signal and the second input signal; and
   charging/discharging a capacitor according to the up signal and the down signal to generate the phase detection result; and
   the step of determining the phase relationship between the first input signal and the second input signal according to the plurality of comparing results comprises:
   after the capacitor is charged/discharged for a predetermined time, determining the phase relationship between the first input signal and the second input signal according to the plurality of comparing results;
   wherein the predetermined time is greater than a cycle of either one of the first and the second input signals.

11. The phase detection method of claim 10, further comprising:
   providing a switch coupled between the capacitor and the second predetermined voltage; and
   generating a control signal to switch on/off the switch.

12. The phase detection method of claim 11, wherein after determining the phase relationship between the first and the second input signals according to the plurality of comparing results, outputting the control signal to switch on the switch in order to make the phase detection result be reset by the second predetermined voltage.

* * * * *